United States Patent [19]
Takuma

[11] Patent Number: 6,072,328
[45] Date of Patent: Jun. 6, 2000

[54] IC DEVICES WITH A BUILT-IN CIRCUIT FOR PROTECTING INTERNAL INFORMATION

[75] Inventor: Toshinori Takuma, Kyoto, Japan

[73] Assignee: Rohm, Co., Ltd., Kyoto, Japan

[21] Appl. No.: 09/159,674

[22] Filed: Sep. 24, 1998

[30] Foreign Application Priority Data

Sep. 25, 1997 [JP] Japan .................................. 9-278044

[51] Int. Cl.[7] ........................ H03K 19/007; H03K 19/20; H03K 19/00; H01J 40/14; G01D 5/34
[52] U.S. Cl. ................................ 326/8; 326/8; 326/104; 326/136; 250/214 R; 250/214 SW; 250/221; 250/222.1; 250/229
[58] Field of Search ................................ 326/8, 104, 136; 250/214 R, 214 SW, 229, 221, 222.1

[56] References Cited

U.S. PATENT DOCUMENTS 4,814,846  12/1989  Matsumoto et al. .................... 357/30
4,870,612   9/1989  Wigur ................................... 364/900
4,887,239  12/1989  Turner ................................... 365/185

FOREIGN PATENT DOCUMENTS 5-68727    9/1993  Japan .
7-200414   8/1995  Japan .
9-128304   5/1997  Japan .

*Primary Examiner*—Michael Tokar
*Assistant Examiner*—V. Tan
*Attorney, Agent, or Firm*—Beall Law Offices

[57] ABSTRACT

A plurality of light-receiving devices dispersed over the area of an IC chip operate in response to the opening of an IC device such that switching transistors are turned on or off to prohibit the normal operation of logic circuits or logic elements, thereby securing protection against normal reading of the internal data of the opened IC device, particularly against the analysis of the IC's internal logic with an electron beam tester.

9 Claims, 2 Drawing Sheets

1

IC DEVICES WITH A BUILT-IN CIRCUIT FOR PROTECTING INTERNAL INFORMATION

BACKGROUND OF THE INVENTION

This invention relates to an IC device with a built-in circuit for protecting internal information. More particularly, the invention relates to IC cards, logic ICs having a program-loaded memory, FPGAs (field programmable gate arrays) and other IC devices with a built-in security circuit for protecting internal information against theft and other unauthorized access to an opened IC.

Various technologies are known in the art of protecting internal IC information against theft. In order to prevent a third party from attempting unauthorized decoding of the contents of memories, various methods have been proposed, particularly in the field of IC cards. One of such methods is by checking for the coincidence between special codes so that unauthorized data accessing turns a failure. Another method is by encrypting the internal data. However, these approaches that rely upon certain data processing are totally ineffective if someone unpacks an IC to have the chip become exposed and scan the bare chip with an electron beam from an electron beam tester. As the result, the internal logic of the IC can be analyzed and subsequent theft of the internal information is also possible.

In IC cards, the use of a plurality of chips such as a CPU and a memory is common. In recent models of IC cards, a plurality of chips are integrated into a single system IC. In this class of circuit configurations, a memory IC is connected to a control IC (e.g. CPU) via a bus and the information in the memory can be analyzed by making a signal transfer between chips or detecting the signal on the bus.

In order to prevent the theft of design information by electron beam analysis of internal IC logic or by analysis of a program or data with reference to the signal transfer between IC chips or the signal on the bus, it has been proposed in Examined Japanese Patent Publication (kokoku) No. 68727/1993 that a coil be provided to distribute electromagnetic energy around the internal electronic circuit. If someone opens an IC by removing its case, the coil detects the event and the detection signal causes the internal data to be destroyed so that it is no longer accessible.

According to the approach proposed in Unexamined Published Japanese Patent Application (kokai) No. 200414/1995, a power line is allowed to run over the entire surface of the substrate so that if someone attempts to remove the IC chip from the substrate, the power line breaks, thereby erasing the information in an SRAM and other memories.

The Applicant for patent of the present invention previously proposed an invention entitled "IC card and IC card module" in Japanese Patent Application No. 128304/1997 (not laid-open), which was characterized by the provision of a circuit which, when an IC card encasing not only an IC chip but also a sensor such as a photodiode that detects the opening of the IC card is opened, is either disabled from performing all or some of its functions normally or abled for prohibiting access to the data in a memory.

However, none of the above-described methods of protecting the internal information of ICs by equipping them with a certain circuit or mechanism for protection against their unauthorized opening are effective against reverse engineering. Someone purchases several ICs of the same model, study and analyze some of them to identify the method of protection they use. Once this is accomplished, the other ICs are tampered with such that the protection circuit or mechanism will not function properly to provide security against the theft of the internal information.

SUMMARY OF THE INVENTION

The present invention has been accomplished under these circumstances and has as an object providing an IC device with a built-in circuit for protecting internal information to insure high security even if the IC device is opened.

This object can be attained by an IC device with a built-in circuit for protecting internal information which incorporates a chip comprising a plurality of integrated circuits or circuit components, at least part of which is selectively connected by a wiring line to allow for a circuit operation having a specified function, which comprises a plurality of light-receiving devices that are dispersed over the area of said chip and integrated with said plurality of circuits or circuit components such as to receive part of the light falling on a surface of said IC chip and a switching transistor that is connected to said wiring line such that it turns on or off in response to the current from said light-receiving devices to prohibit the normal operation of at least one of said circuits or circuit components, said switching transistor being turned on or off in its operational state when said IC device is opened.

As just described above, a plurality of light-receiving devices are dispersed over the area of the chip and when the IC device is opened, the light-receiving devices operate to turn on or off the associated switching transistors such that logic circuits or logic elements will not operate normally, thereby ensuring that no internal data will be read normally from the opened IC device. What is worth particular mention is that the internal logic of the opened IC device cannot be analyzed by examination with an electron beam tester or like means. What is more, the integrated light-receiving devices are hard to distinguish from other transistors on the IC device, so shielding only the regions of selected light-receiving devices is very difficult, making it practically impossible to get around those regions when an electron beam is scanned over the IC device with an electron beam tester or the like.

If the unpacked IC is entirely shielded from light, no current will flow out of the light-receiving devices to turn on or off the switching transistor. However, if a circuit for coupling a memory cell to the light-receiving devices is adopted and the generation of a photocurrent is stored in the memory cell, the state of the unpacked IC can be remembered. As a result, the IC device will no longer operate normally once it is opened and this provides a solution to the above-mentioned problem. Briefly, a switching transistor is provided on a connection line and data is written into a nonvolatile memory cell by means of the light-receiving devices, whereby the switching transistor is turned on or off.

In this arrangement, the current from the light-receiving device serves as a WRITE current into the nonvolatile memory cell to store the state of light reception by that device; once light-receiving devices have received light, that event is stored and the line connecting logic circuits or logic elements is cut off, provided with continuity or connected to a ground line, whereby the logic circuits or elements are no longer capable of normal operation. As the result, no data can be read out of memories around the logic or it is at least impossible to read the correct data during operation, thereby allowing for the protection of the internal data in the IC device of interest.

The overall effect of these features is the ability to insure the high security of internal information against unauthorized opening of the IC device.

DESCRIPTION OF THE PREFERRED EMBODIMENT

Figure 1:
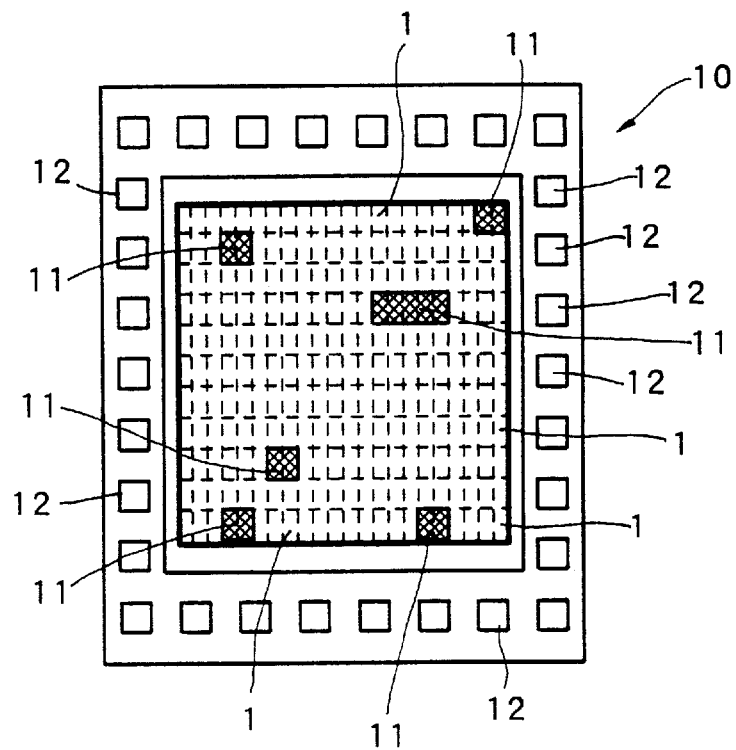
FIG. 1 is an illustration of a FPGA employing the IC device of the invention which is equipped with a circuit for protecting internal information.

The FPGA generally indicated by 10 in FIG. 1 is one of a flash memory type (EEPROM) and comprises a matrix array of regions 1 of a size called "tile" (which regions are hereinafter referred to as "tiles"), combined with basic logic element forming regions, internal wiring lines for these basic logic elements, a matrix of wiring lines connecting one tile to another and flash memory switch cells for connecting the two groups of wiring lines.

Each flash memory cell consists of a switching transistor and an EEPROM memory cell, with the transistor located at the intersection of two wiring lines. When data is written into the memory cell formed in association with it, the switch turns on or off to establish a selective connection of wiring lines. In this way, desired devices are formed and incorporated into FPGA 10.

Indicated by 11 are phototransistors integrated simultaneously with the making of devices out of tiles. Tiles 1 are interspersed with a plurality of phototransistors such that their light-receiving surfaces of a size corresponding to one or more tiles are connected in parallel and dispersed over the entire device area. Since a large current must usually be produced upon light reception, it is preferred to use a region of a size corresponding to a plurality of parallel-connected tiles.

The matrix wiring for connecting one tile to another is laced on top of the light-receiving surface of hototransistor 11 so as to occupy part of said surface. Namely, the light-receiving surfaces of light-receiving devices which are formed under certain of said matrix of wiring lines. This makes the integrated phototransistors difficult to distinguish from the tiles as seen from the outside. Needless to say, the matrix wiring may be placed under the light-receiving surface of phototransistor 11.

Indicated by 12 are pads for providing connections to external terminals. In FIG. 1, the wiring of the devices formed on tiles 1 to pads 12 and further to external terminals are omitted.

The tile regions in which the phototransistors 11 are formed are usually impossible to distinguish as ICs from other transistors by visual inspection. Therefore, it is difficult to know where the phototransistors 11 are located. This is particularly true when phototransistors 11 are formed in areas of the size of one or more tiles 1 so that they look just like the tiles.

Figure 2:
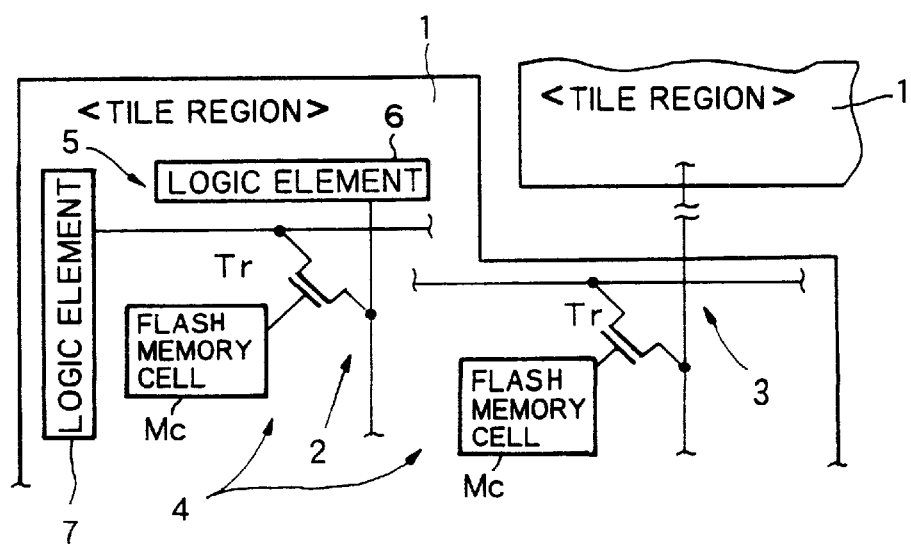
FIG. 2 illustrates how tiles in the FPGA are connected to phototransistors.

A flash memory cell that serves as a switching cell on tile 1 and a switching transistor that establishes connections of matrix wiring lines are connected as shown in FIG. 2. For one switching MOSFET transistor Tr, there is assigned one flash memory cell Mc. Transistor Tr receives at the gate an output corresponding to the storage of either "1" or "0" and turns on when "0" is stored in the memory cell. As the result, the vertical and horizontal lines to which the energized transistor Tr is connected establish a connection. Of course, this is not the case if the transistor turns off when "1" is stored in the memory cell.

Indicated by 6 and 7 are logic elements such as inverters and NAND gates formed within tiles. Logic elements 6 and 7 belong to a basic logic gate region 5 that are connected by wiring lines in an in-tile connection wiring matrix 2. Indicated by 3 is an out-of-tile wiring matrix which provides connection to devices and so forth that are formed on other tiles. Indicated by 4 is a switching cell region containing a flash memory Mc as a programmable nonvolatile memory.

The actual FPGA contains many matrixes of wiring lines both within and outside tiles but for the sake of convenience, only one each of the in-tile connection wiring matrix 2 and the out-of-tile wiring matrix 3 is shown in FIG. 1.

Figure 3:
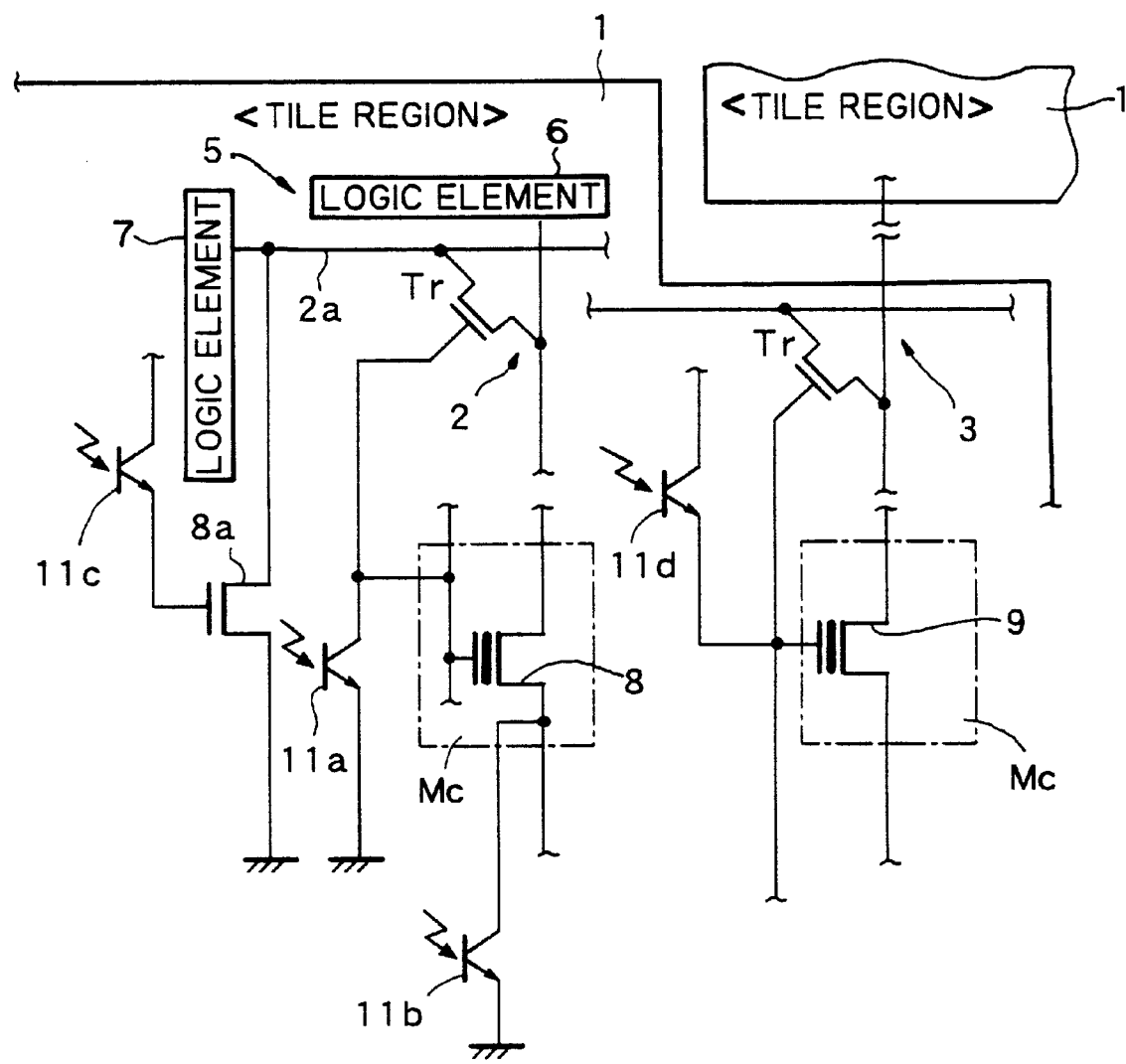
FIG. 3 illustrates how phototransistors are connected to logic elements.

FIG. 3 shows a tile in FIG. 2 to which phototransistors 11 have been connected. For the sake of convenience, the phototransistors 11 have been moved to be located within a tile and are associated with wiring as phototransistors 11a–11d. The actual positions in which the phototransistors 11a–11d are located are those where phototransistors 11 are integrated as shown in FIG. 1.

The above-mentioned phototransistors are such that two or more of them are connected in parallel. Even in this case, the phototransistors 11a–11d are each described below as a single device.

Phototransistor 11a is provided between the gate of a selected transistor Tr in the in-tile connection wiring matrix 2 and the ground GND. Phototransistor 11b is connected between the ground GND and a bit line of a floating-gate type switching transistor 8 in a flash memory cell that turns on and off the transistor Tr that works as a switching circuit in the in-tile wiring matrix 2. When the phototransistor 11b turns on, the bit line of the switching transistor 8 is grounded. Phototransistor 11c is connected to the gate of a MOSFET transistor 8a which, when turned on, works as a switching circuit that connects a line 2a from the in-tile wiring matrix 2 to the ground. Hence, if the phototransistor 11c receives more light than a specified value, the transistor 8a turns on to connect the line 2a to the ground.

Phototransistor 11d is connected to the gate of a floating-gate type switching transistor 9 in a flash memory cell that turns on and off the transistor Tr which works as a switching circuit in the out-of-tile wiring matrix 3. Hence, if the phototransistor 11d is energized, a photocurrent flows into the transistor 9, causing "0" to be written into the flash memory cell Mc.

The phototransistors 11a, 11b, 11c and 11d each correspond to any one of the phototransistors 11 shown in FIG. 1.

Speaking of the flash memory cell, it takes on a state "0" when data is written and a state "1" when no data is written or when data "1" is written. The memory cell takes on a state "0" when it is programmed for "connection established".

With the phototransistors being inserted and connected in the arrangement just described above, let us suppose that the IC device of interest has been opened by an unauthorized person. The phototransistor 11a receives external light to produce a photocurrent, whereupon the gate of the transistor Tr in the in-tile wiring matrix 2 is grounded so that it turns off in its operational state. As the result, the logic element 6 and the logic element 7 which have been connected via the in-tile connection wiring matrix 2 are no longer connected. The photocurrent flowing from the phototransistor 11b upon reception of external light also causes the drain of the floating-gate type transistor 8 to be grounded, whereupon the data stored in the flash memory Mc assumes the value "1" and is erased in its operational state. This also causes the transistor Tr in the in-tile wiring matrix 2 to be turned off.

In addition, the current form the phototransistor 11c flows into the gate of transistor 8a, which then turns on to connect the line 2a to the ground in its operational state. As the result, the device composed of the logic elements 6 and 7 are no longer capable of performing its function.

In the out-of-tile wiring matrix 3, the current from the transistor lid flows into the flash memory to write "0" in it, whereupon the matrix 3 is brought into a "connected state", where the logic device in the tile 1 is connected to a logic device which would otherwise remain unconnected. Preferably, the lines that establish a connection in response to the reception of light by the light-receiving device are such that those lines to which the logic would not otherwise be connected are selectively connected. If this is not the case, the intended selection cannot always be made since the flash memory to which the phototransistor 11c is connected is occasionally preloaded with "0". On the other hand, if a multiple of phototransistors 11c are provided, there should be at least one flash memory of which the content can be changed from "1" to "0" and it is not necessarily required to connect the light-receiving device to a particular connection line.

As a consequence of the above procedure, the logic region having phototransistors 11a–11d is no longer functional. In particular, the phototransistor connected to a flash memory experiences a change in the state of its connection to a logic element when altered information is stored in the nonvolatile memory. The phototransistors 11a–11d operate in the same way when they are scanned with an electron beam from an electron beam tester in a dark room and the logic will by no means restore the initial state.

As the result, no data can be read out of memories around the logic or it is at least impossible to read the correct data, thereby allowing for the protection of the internal data in the IC device of interest.

An even better way to establish a connection that prohibits the restoration of the initial logic state is by replacing the MOS transistor 8a connected to the line 2a with a floating-gate type transistor capable of storing information.

The phototransistors 11a–11d are dispersed over the device area as shown in FIG. 1 and cannot be distinguished from other transistors as ICs if seen from the outside; therefore, it is practically impossible to block all phototransistor regions from light each time the IC device of interest is unpacked. On the other hand, it is extremely difficult to open the IC device in the dark.

This is how the security of the information written into a FPGA or the associated flash memories can be improved in accordance with the present invention. In addition to the FPGA, IC cards incorporating logic ICs such as non-FPGA gate arrays and associated memories often employ the aforementioned EEPROM and, hence, permit the use of a circuit configuration in which the phototransistor 11 is connected to the associated flash memory cell (all-erasable EEPROM) and light-receiving device in the same manner as described above. Speaking of the memory, its data reading portion is always furnished with a logic circuit such as a register or a gate circuit and, hence, the important internal information can be protected by providing the pertinent connecting line with phototransistors 11a and 11b in the arrangement already described above. This also enables the security of the internal information to be enhanced as much as has been done in the foregoing embodiment. Hence, the applicability of the present invention is by no means limited to the FPGA. Needless to say, the concept of the invention is also applicable to an FPGA that uses not only flash memories but also other nonvolatile memories such as FeRAM and EEPROM in switching cells; the invention is even applicable to an EPGA using an SRAM.

What is claimed is:

1. An IC device with a built-in circuit for protecting internal information which incorporates a chip comprising a plurality of integrated circuits or circuit components, at least part of which is selectively connected by a wiring line to allow for a circuit operation having a specified function, which comprises:

a plurality of light-receiving devices that are dispersed over the area of said chip and integrated with said plurality of circuits or circuit components such as to receive part of the light falling on a surface of said IC chip; and a switching transistor that is connected to said wiring line such that it turns on or off in response to the current from said light-receiving elements to prohibit the normal operation of at least one of said circuits or circuit components, said switching transistor being turned on or off in its operational state when said IC device is opened.

2. The IC device with a built-in circuit for protecting internal information according to claim 1, which further includes a memory and wherein said prohibition of the normal operation of at least one of said circuits or circuit components is such that the data stored in said memory cannot normally be read out of said memory.

3. The IC device with a built-in circuit for protecting internal information according to claim 1, which further includes a memory and wherein said memory is a nonvolatile memory, said wiring line is formed in plurality, said switching transistor is provided in plurality in correspondence with said plurality of wiring lines, at least one of said circuits or circuit components is a logic circuit or a logic element, and at least one of said switching transistors is turned on or off in response to a current from said plurality of light-receiving devices.

4. The IC device with a built-in circuit for protecting internal information according to claim 3, wherein at least one of said wiring lines is a connection line connected to either one of said nonvolatile memory, said logic circuit and said logic element.

5. The IC device with a built-in circuit for protecting internal information according to claim 4, wherein said switching transistors, when turned on or off, selectively connect said logic circuit or said logic element to either one of the ground and other circuits or circuit elements or disconnect said logic circuit or said logic element from other circuits, and wherein the memory cell of said nonvolatile memory stores information for selective connection or disconnection.

6. The IC device with a built-in circuit for protecting internal information according to claim 5, wherein said memory cell sets said switching transistors in either an on or off state depending upon whether "1" or "0" is written into the cell and wherein at least one of said light-receiving devices is connected to a line that permits the information of "1" or "0" to be written into said memory cell so that said switching transistors are set in the on or off state in response to the photocurrent supplied from at least one of said light-receiving devices.

7. The IC device with a built-in circuit for protecting internal information according to claim 6, which is a field programmable gate array having a matrix of wiring lines and wherein said memory cell is a flash memory that stores the information about the connection of said matrix of wiring lines.

8. The IC device with a built-in circuit for protecting internal information according to claim 7, wherein the light-receiving surfaces of said light-receiving devices are formed under certain of said matrix of wiring lines.

9. The IC device with a built-in circuit for protecting internal information according to claim 8, wherein said light-receiving surfaces are of a size substantially equal to one or more of the tiles in the field programmable gate array.

* * * * *